United States Patent

Aubel et al.

(10) Patent No.: US 8,314,625 B2
(45) Date of Patent: Nov. 20, 2012

(54) BUILT-IN COMPLIANCE IN TEST STRUCTURES FOR LEAKAGE AND DIELECTRIC BREAKDOWN OF DIELECTRIC MATERIALS OF METALLIZATION SYSTEMS OF SEMICONDUCTOR DEVICES

(75) Inventors: Oliver Aubel, Dresden (DE); Frank Feustel, Dresden (DE); Torsten Schmidt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 445 days.

(21) Appl. No.: 12/620,664

(22) Filed: Nov. 18, 2009

(65) Prior Publication Data

US 2010/0134125 A1 Jun. 3, 2010

(30) Foreign Application Priority Data

Nov. 28, 2008 (DE) .................. 10 2008 059 504

(51) Int. Cl.
*G01R 31/3187* (2006.01)
*G01R 31/26* (2006.01)
(52) U.S. Cl. ................. 324/750.3; 324/762.01
(58) Field of Classification Search .. 324/762.01–762.1, 324/750.01–750.3, 754.01–754.3, 755.01–755.11; 438/14–18; 257/48
See application file for complete search history.

(56) References Cited

U.S. PATENT DOCUMENTS

| 5,416,034 | A * | 5/1995 | Bryant .................... 438/238 |
| 5,635,893 | A * | 6/1997 | Spraggins et al. ............ 338/48 |
| 7,358,714 | B2 * | 4/2008 | Watanabe et al. ............ 324/73.1 |
| 7,719,887 | B2 * | 5/2010 | Cannon et al. ............... 365/163 |
| 7,829,889 | B2 * | 11/2010 | Lehr .......................... 257/48 |
| 2007/0252611 | A1 | 11/2007 | Kerber ........................ 324/763 |

FOREIGN PATENT DOCUMENTS

DE 102006025351 A1 12/2007

OTHER PUBLICATIONS

Translation of Official Communication from German Patent Office for German Patent Application No. 10 2008 059 504.7 dated Sep. 16, 2009.

* cited by examiner

*Primary Examiner* — Tung X Nguyen
(74) *Attorney, Agent, or Firm* — Williams, Morgan & Amerson, P.C.

(57) ABSTRACT

In a test structure for determining dielectric breakdown events of a metallization system of semiconductor devices, a built-in compliance functionality may allow reliable switching off of the test voltage prior to causing high leakage currents, which may conventionally result in significant damage. Consequently, further failure analysis may be possible after the occurrence of a dielectric breakdown event.

19 Claims, 5 Drawing Sheets

BUILT-IN COMPLIANCE IN TEST STRUCTURES FOR LEAKAGE AND DIELECTRIC BREAKDOWN OF DIELECTRIC MATERIALS OF METALLIZATION SYSTEMS OF SEMICONDUCTOR DEVICES

BACKGROUND OF THE INVENTION

1. Field of the Invention

Generally, the present disclosure relates to microstructures, such as advanced integrated circuits, and, more particularly, to metallization systems comprising sophisticated dielectric and conductive materials.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases more rapidly than the number of circuit elements. Thus, usually, a plurality of stacked "wiring" layers, also referred to as metallization layers, are provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per $cm^2$ in the individual interconnect structures, despite the provision of a relatively large number of metallization layers, owing to the significant number of circuit elements per unit area. Consequently, well-established materials, such as aluminum, are being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine, and the like, into the copper. Furthermore, the conductive barrier layers may also provide highly stable interfaces with the copper, thereby reducing the probability for significant material transport at the interface, which is typically a critical region in view of increased diffusion paths that may facilitate current-induced material diffusion. Currently, tantalum, titanium, tungsten and their compounds, with nitrogen and silicon and the like, are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first, a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, the copper microstructure and the like, and their mutual interaction on the characteristics of the interconnect structure as a whole so as to insure both high yield and the required product reliability. In particular, it is important to identify, monitor and reduce degradation and failure mechanisms in metallization systems for various configurations so as to maintain device reliability for every new device generation or technology node.

Accordingly, a great deal of effort is being made in investigating the degradation of copper interconnects, especially in combination with low-k dielectric materials or ultra low-k (ULK) materials having a relative permittivity of 3.0 or even less, in order to find new materials and process strategies for forming copper-based lines and vias with a low overall permittivity.

One failure mechanism, which is believed to significantly contribute to a premature device failure, is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and nitrogen-containing silicon carbide, which exhibit a moderately high etch selectivity to typically employed interlayer dielectrics, such as a plurality of low-k dielectric materials, and also suppress the diffusion of copper into the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall resistance of the corresponding metal line. For instance, various alloys, such as a compound of cobalt/tungsten/phosphorous (CoWP), a compound of nickel/molybdenum/phosphorous (NiMoP) and the like, have proven to be promising candidates for conductive cap layers, which may significantly reduce electromigration effects within a corresponding metal line. Although these compounds provide superior electromigration performance and may be implemented into the overall process flow for manufacturing complex metallization systems, since these compounds may be efficiently deposited on the basis of selective electrochemical deposition recipes, it turns out, however, that severe defects may be observed in metallization systems including copper lines with a conductive cap layer. For example, increased leakage currents and dielectric breakdown may occur in such devices compared to devices having a metallization system based on a dielectric cap layer.

In addition, during operation of the device, a reduced time to dielectric breakdown may be observed in sophisticated metallization systems, wherein it is believed that a dominant source of the premature dielectric breakdown may represent the interface between the dielectric materials of two subsequent metallization layers in closely spaced metal lines, as will be explained with reference to FIG. 1a.

FIG. 1a schematically illustrates a cross-sectional view of a semiconductor device 100 comprising a substrate 101, in and above which may be formed circuit elements, such as transistors and the like, as required by the overall circuit configuration of the semiconductor device 100. As previously indicated, the continuous shrinkage of the critical feature sizes, which may currently be at approximately 50 nm and less, requires a corresponding adaptation of the feature sizes of metal lines and vias in a metallization system 130 of the device 100. In the example shown in FIG. 1a, the metallization system 130 may comprise, in the manufacturing stage shown, a metallization layer 110 in a substantially complete state and a metallization layer 120 prior to patterning the corresponding dielectric material contained therein. The metallization layer 110 may comprise a dielectric material 111, such as a low-k dielectric material, and a plurality of metal lines 112, which may typically include a highly conductive metal 112A, such as copper, in combination with a conductive barrier material 112B, such as tantalum, tantalum nitride and the like. Furthermore, with respect to enhanced copper confinement and electromigration behavior, frequently, a conductive cap layer 113 may be formed on a top surface 112S of the metal region 112. As previously explained, a plurality of alloys may be used, which may have a moderately low resistivity while at the same time providing a strong interface with the surface 112S, which may, therefore, result in a reduced degree of current-induced material diffusion, as explained above. Typically, the metal lines 112 have a certain degree of tapering so that the critical dimension 112W in the vicinity of the top surface 112S may be greater compared to the corresponding critical width 112W at the bottom of the metal lines 112. Consequently, the distance 112D between neighboring closely spaced metal lines is shortest at an interface 111S of the dielectric material 111 with a subsequent dielectric material 122, which may be considered as a dielectric material of the subsequent metallization layer 120 or which may be considered as a cap or cover layer of the dielectric material 111. At any rate, the dielectric materials 122, 111 may typically differ in material composition so that diffusion paths for any contaminants, such as metal residues and the like, may preferably take place at the interface 111S. Furthermore, a further dielectric material 121, such as a low-k dielectric material and the like, may be formed on the dielectric layer 122.

Typically, the semiconductor device 100 as shown in FIG. 1a may be formed on the basis of the following process techniques. After fabricating any circuit elements in and above the substrate 101 based on well-established techniques according to specific design rules, which may require critical dimensions of 50 nm and significantly less for circuit elements, such as transistors and the like, an appropriate contact structure (not shown) may be formed so as to connect the corresponding circuit elements with the metallization system 130. Thereafter, the metallization system 130 may be formed, wherein the number and the configuration of the individual metallization layers 110, 120 may depend on the complexity and design criteria of the circuit provided by the circuit elements in the device level, as previously explained. For example, the metallization layer 110 including the metal lines 112 may be formed by depositing the dielectric material 111, which may represent a material of reduced permittivity, by any appropriate deposition technique, such as plasma enhanced chemical vapor deposition (CVD), spin-on techniques and the like. Thereafter, an appropriate etch mask may be formed on the basis of lithography, wherein hard mask materials may be used, if required, in order to define the lateral dimension 112W and the spacing 112D between adjacent metal lines 112. Thereafter, an anisotropic etch process may be performed on the basis of well-established recipes, during which a certain degree of tapering may be created so that, typically, the width 112W and the spacing 112D may have to be selected as large as is compatible with the overall design rules for a given high density of the metal lines 112. After the etch process and removal of the corresponding etch mask, the barrier material 112B may be formed, for instance, by sputter deposition and the like, followed by the filling in of the copper material, which may typically be accomplished by electrochemical deposition techniques. Thereafter, excess material of the copper fill material and of the conductive barrier layer 112B may be removed, wherein, typically, chemical mechanical polishing (CMP) techniques may be used. Consequently, during a final phase of a corresponding polishing sequence, copper material, barrier material and material of the dielectric layer 111 may be exposed to the polishing ambient, which may result in a certain degree of "copper contamination" of the surface 111S of the dielectric material 111. Although highly efficient cleaning processes may be performed in a later manufacturing stage, nevertheless, the presence of even minute copper residues may contribute to a reduced dielectric strength, in particular at the interface 111S, at which also the distance between neighboring metal lines 112 may be shortest. The situation may even become more critical in semiconductor devices in which the metal-containing cap material 113 may be provided. For this purpose, typically, a further electrochemical deposition process, frequently an electroless process, may be performed to selectively deposit the desired conductive cap material 113 on the surface portions 112S. During this process, exposed surface areas of the dielectric material 111 may also come into contact with electrolyte solutions comprising metal atoms which may also diffuse into the dielectric material to a certain degree. Thus, cleaning processes may be performed after the electroless deposition process to remove contaminants, wherein, however, minute metal residues may still remain from preceding chemical mechanical polishing of the copper material and the subsequent electroless deposition of the conductive cap material 113. Thereafter, the dielectric material 122 may be deposited, for instance by plasma enhanced CVD techniques, wherein the material 122 may act as an etch stop material during the patterning of the dielectric material 121 of the metallization layer 120. For example, silicon carbide, nitrogen-containing silicon carbide and the like may frequently be used as appropriate etch stop materials. However, due to a specific mismatch in material composition and molecular structure between the materials 122 and the dielectric material 111, the interface 111S may represent a diffusion path for metal residues which may result in an even further reduced dielectric strength upon operating the device 100, in which, typically, repeatedly moderately high temperatures may be created within the metallization system 130.

The dielectric material 121 may be deposited and may be subsequently patterned by using the layer 122 as a stop material, wherein vias and metal lines may be subsequently formed in the metallization layer 120.

Thus, the close proximity of the metal lines 112, in particular at the interface 112S, may provide increased electrical fields upon operation of the device 100, which may even become more critical due to the less stable interface 111S and the presence of even minute metal residues, for instance, in the form of copper or material of the conductive cap layer 113. Therefore, premature failure, that is, dielectric breakdown, may be observed in metallization levels of critical semiconductor devices.

For this reason, great efforts are being made in determining failures in the metallization systems and trying to locate corresponding reasons in the highly complex manufacturing flow and corresponding materials used therein. To this end, appropriately configured test structures are typically provided in the semiconductor devices, which may then be examined under predefined stress conditions, such as elevated temperatures, moderately high voltages and the like, in order to detect any weaknesses in the metallization system and the associated manufacturing techniques.

FIG. 1b schematically illustrates a top view of a typical test structure, which may represent a portion of a semiconductor device, such as the device 100, as previously described. The test structure 150 is typically provided as a portion of the metallization system, for instance as a portion of the metallization layer 110, as previously described. For example, the test structure 150 may be fabricated along with actual device features in the metallization layer 110, however, in dedicated device areas such as scribe lanes and the like, or even within the die area of actual semiconductor devices. In other cases, the test structures 150 may be formed on dedicated die areas or even test substrates, depending on the overall manufacturing strategy. The test structure 150 may thus comprise metal lines 112, which may have a similar configuration as previously described with reference to FIG. 1a. However, the metal lines 112 may not necessarily represent functional entities but may have an appropriate configuration, for instance with respect to the distance of two adjacent metal lines and the corresponding lateral dimensions thereof in order to provide information on the actual dielectric characteristics in the remaining metallization layer 110 formed above the actual device regions. For example, the line width and the spacing, as well as the configuration, may be substantially identical as in critical areas of the metallization layer 110 when actual device features are considered. In other cases, any other appropriate configuration may be realized, for instance, in view of determining minimum required distances with respect to a given manufacturing sequence so as to evaluate any technology inherent limitations and the like. Consequently, based on the test structure 150, the dielectric characteristics of the metallization layer 110 may be evaluated, for instance, in view of reliability with respect to a premature failure, as is also explained above in more detail. To this end, the test structure 150 may be exposed to certain stress conditions, indicated by 151, such as elevated temperature, humidity, mechanical stress and the like, while also a corresponding voltage may be applied across the test structure 150. For this purpose, an appropriate interconnect structure 130, which is merely schematically illustrated in FIG. 1b, is provided and is appropriately configured to enable electrical access by external test equipment, which in turn supplies an appropriate test voltage across the test structure 150. Moreover, during the sophisticated test conditions 151 and based on the appropriate test voltage, the corresponding induced leakage current is monitored in order to identify a failure in the test structure 150, i.e., a rapid increase of the current.

FIG. 1c schematically illustrates a typical progression of the leakage current obtained through the above-described test procedure. As indicated, a moderately low leakage current may be observed, as long as any modifications of the test structure 150 may not result in a significant modification of the dielectric material 111 and/or the metal lines 112. Usually, a corresponding modification may occur, such as a dielectric breakdown, which may result in a drastic increase of the leakage current, as indicated by the time $T_0$, which may thus be considered as a failure in the test structure 150, thereby also indicating a corresponding weakness of actual metallization systems. Consequently, on the basis of the time $T_0$, the reliability of the test structure 150 and thus of any metal line configuration and manufacturing techniques used for forming the test structure 150 may be evaluated with respect to reliability. However, due to the very complex manufacturing flow, as previously described, a large number of aspects may contribute to the dielectric breakdown which, however, may not be substantially assessed or evaluated on the basis of the test structure 150. That is, typically, the rapid increase of the current during the test procedure described above may result in a catastrophic failure in a corresponding region of the test structure 150, which may result in a rupture of dielectric materials and massive damage so that any further analysis, for instance by cross-sectional analysis and the like, may not provide any valuable information about a failure mechanism. Thus, it would be desirable to shut off test voltage before the leakage current may have exceeded critical values so that a corresponding catastrophic failure may not be induced, thereby allowing, upon detecting a corresponding failure in the test structure 150, further analysis of the corresponding failure region in the structure 150. It turns out, however, that a corresponding increase of the leakage current may occur within very short time intervals, for instance within several nanoseconds, which may be extremely difficult to be detected and evaluated by the external test circuitry.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides test structures, manufacturing techniques and methods of using the test structures in which additional information may be obtained upon detecting a failure in a test structure, which may be accomplished by providing a "built-in compliance" function in the test structure to significantly reduce the slope of increase of current upon occurrence of a failure in the test structure. Consequently, the voltage may be appropriately reduced or switched off while substantially avoiding a catastrophic failure in the involved area of the test structure, which may now be available for further analysis in order to obtain further information with respect to the associated failure mechanisms. Consequently, based on the test structures having the built-in current limiting functionality, the dielectric characteristics of sophisticated metallization systems, i.e., the behavior in view of a "response" of the dielectric materials to applied voltages and with respect to reducing parasitic leakage currents in the dielectric material of metallization systems, may be investigated with significantly enhanced efficiency, since the same test structure may be used for determining the reliability by determining the point in time of a corresponding failure, while efficiently avoiding the rapid increase in current caused by the failure so that "secondary" effects caused by increased current flow itself may be maintained at a low level. To this end, a test structure may be connected to a current limiting structure which may thus have an appropriate "time constant" with respect to the respective failure mechanisms in order to sufficiently slow down the increase of current upon a failure, so that external test equipment may efficiently switch off or at least reduce the test voltage. In some illustrative aspects disclosed herein, the current limiting effect may be obtained by a resistive structure provided in the metallization system, while, in other cases, resistive structures formed in the device level, for instance on the basis of a semiconductor material, may be used. In still other illustrative embodiments, a current controlling effect may be accomplished on the basis of respective transistor elements, which may be appropriately controlled by the voltage across the actual test region of the test structure so that a corresponding control of the overall current flow may be obtained on the basis of a typical time constant given by device-internal transistor elements. In still other illustrative embodiments, a self-limiting current control mechanism may be implemented by using a resistive structure on the basis of "electronic fuses," in which the current flow may result in a reduced conductivity of the resistive structure, thereby also restricting the current flow in the actual test region of the test structure.

One illustrative test structure disclosed herein relates to the monitoring of dielectric characteristics of a metallization system of a semiconductor device. The test structure comprises a test region formed above a substrate and comprising a plurality of test metal regions formed in a dielectric material of a metallization level. Furthermore, a current limiting structure is formed above the substrate. Additionally, an interconnect structure is provided and is connected with the test region and the current limiting structure, wherein the interconnect structure is configured to electrically connect the current limiting structure and the test region and to enable application of a voltage within a specified range across the test region and the current limiting structure by an external test device.

One illustrative dielectric breakdown test structure comprises a test region formed in a metallization system of a semiconductor device and a resistive structure that is electrically connected in series with the test region. Finally, the dielectric breakdown test structure comprises an interconnect structure that is at least partially formed in the metallization system and is electrically connected to the test region and the resistive structure. The interconnect structure is configured to enable electrical contact with an external test device.

One illustrative method disclosed herein comprises providing a test structure comprising a test region for testing dielectric characteristics of a metallization system of a semiconductor device, wherein the test structure further comprises an internal current limiting structure that is connected in series with the test region. The method additionally comprises applying a voltage across the test region and the current limiting structure and monitoring a current flowing through the test region. Finally, the method comprises at least reducing the voltage when the current exceeds a predefined threshold.

BRIEF DESCRIPTION OF THE DRAWINGS

The disclosure may be understood by reference to the following description taken in conjunction with the accompanying drawings, in which like reference numerals identify like elements, and in which.

Figure 1A:
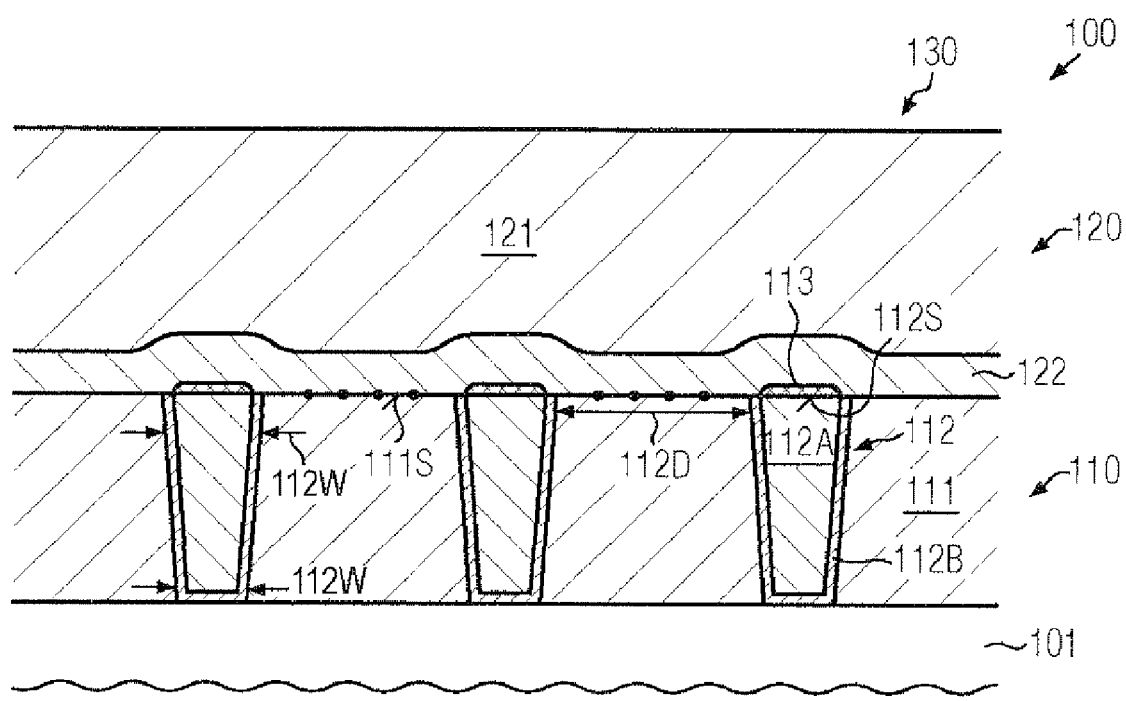
FIG. 1a schematically illustrates a cross-sectional view of a sophisticated semiconductor device comprising a metallization system formed on the basis of advanced manufacturing techniques and materials, the characteristics of which are to be examined.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and test structures and thus semiconductor devices in which the dielectric characteristics, for instance the dielectric strength of sophisticated dielectric materials, such as low-k dielectric materials, may be evaluated on the basis of more efficient test structures by substantially avoiding any "secondary" effects of a high current, which may be generated upon occurrence of a failure in a test structure. This may be accomplished by adding a device-internal current limiting mechanism to provide a sufficient time interval for switching off or reducing the externally supplied test voltage. For this purpose, an appropriate current limiting structure may be connected in series with the actual test region of the test structure so that the rise of the current upon failure may be slowed down by the current limiting structure. In some illustrative embodiments, a restrictive structure may per se or additionally comprise a self-limiting mechanism, for instance by increasing the interior resistivity upon increasing the current flowing through the resistive structure. For example, in some illustrative embodiments, transistor elements may be provided within the current path of the leakage current, wherein the transistors may be controlled to be less conductive upon an increase of the load current flowing through the transistor. In other illustrative embodiments, appropriate resistive structures, such as resistive elements in the form of electronic fuses, may be used in a dynamic manner by appropriately dimensioning these components such that an undue increase of current may significantly reduce the conductivity of the resistive component. For example, electronic fuses may represent silicon-based components, in which a metal silicide may provide enhanced conductivity. However, the overall configuration of the silicon-based component may be selected so that, upon occurrence of a higher current, significant electromigration effects and other typically negatively assessed effects may result in a metal silicide depletion, thereby reducing the conductivity of the corresponding silicon-based component. Consequently, also in this case, a self-controlling reduction of conductivity and thus of current may be accomplished, thereby "protecting" the actual test region in order to allow further access to a corresponding failure region created therein during the preceding reliability test.

Figure 1B:
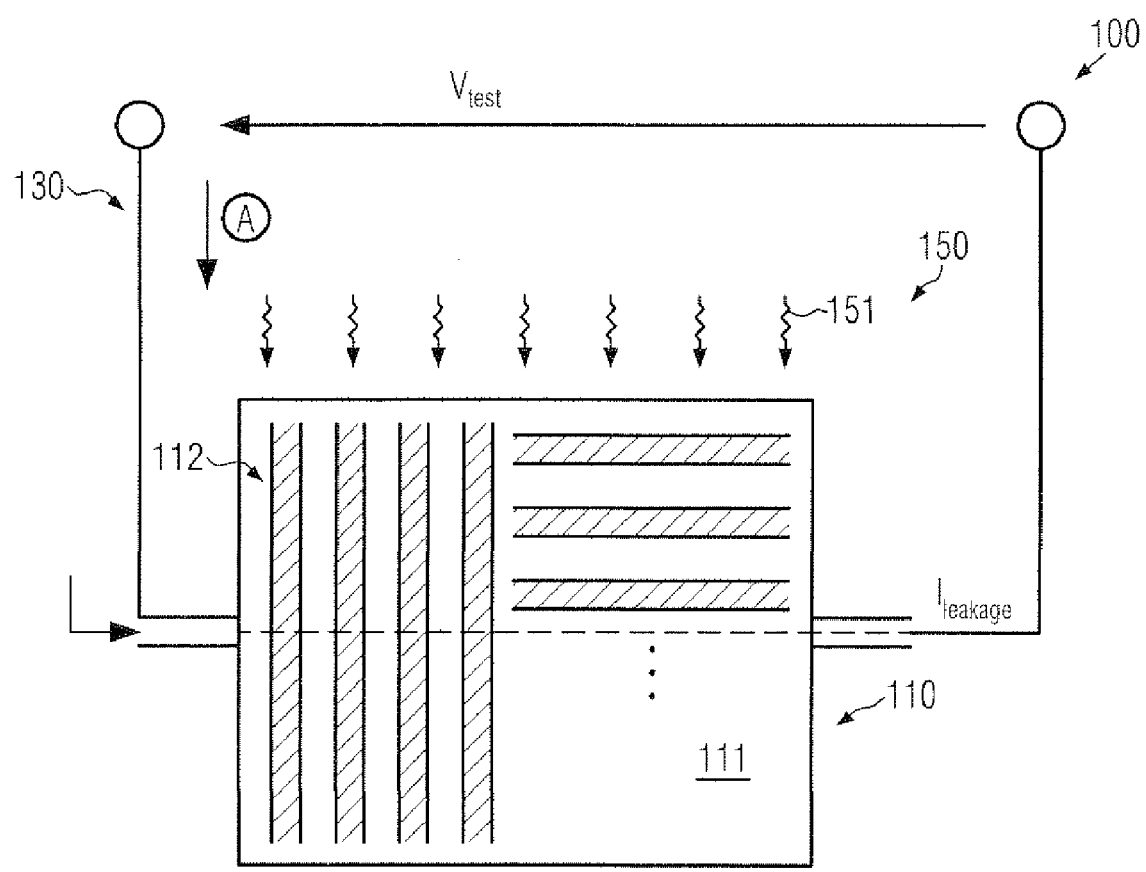
FIG. 1b schematically illustrates a top view of a conventional test structure for determining the dielectric characteristics of sophisticated metallization systems.
Figure 1C:
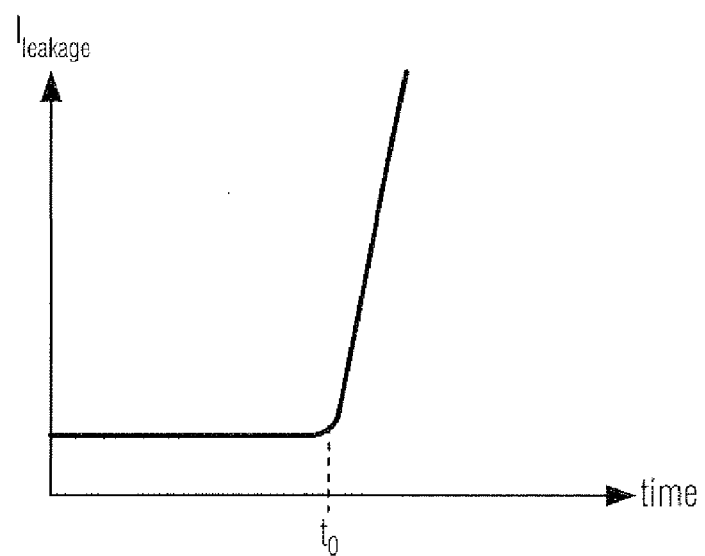
FIG. 1c schematically illustrates a graph for determining a reliability failure of the test structure of FIG. 1b, according to conventional strategies.

With reference to FIGS. 2a-2f, further illustrative embodiments will now be described in more detail, wherein reference may also be made to FIGS. 1a-1c with respect to manufacturing techniques for forming metallization systems and the like.

Figure 2A:
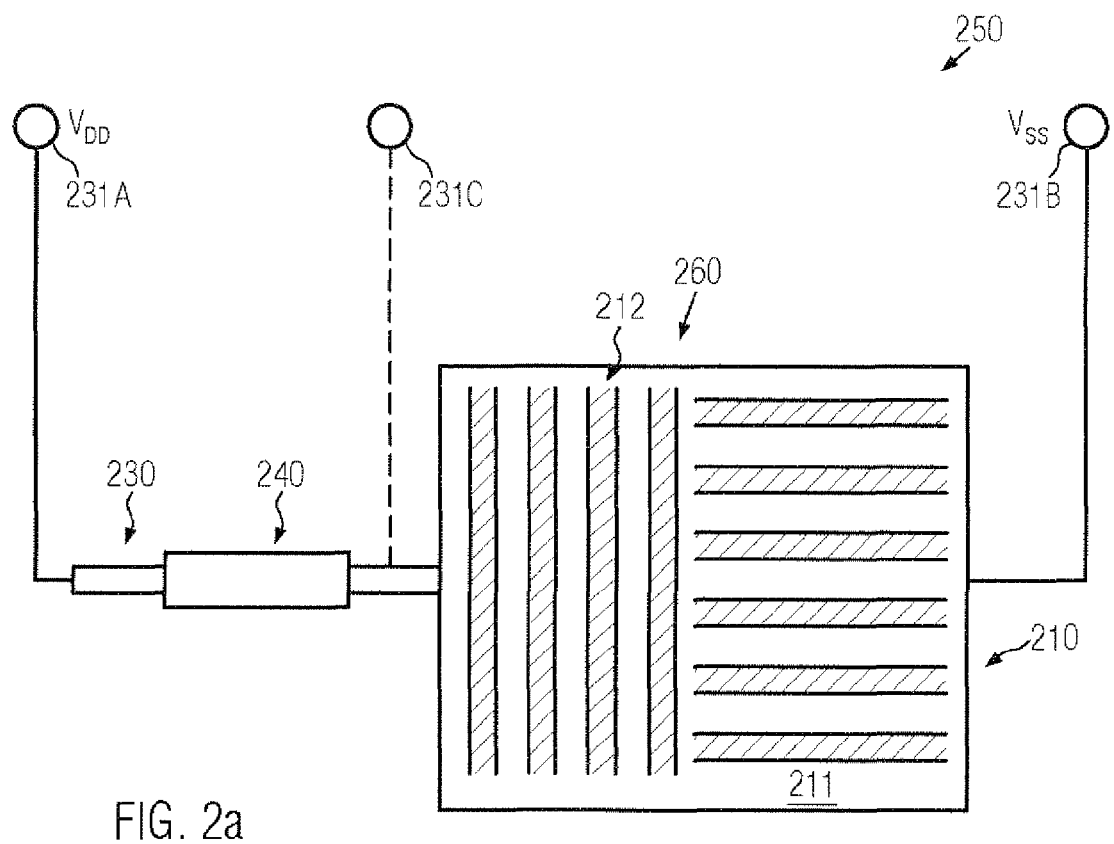
FIG. 2a schematically illustrates a top view of a test structure including a built-in compliance functionality, according to illustrative embodiments.

FIG. 2a schematically illustrates a top view of a test structure 250, which is appropriately designed to estimate the dielectric characteristics of sophisticated metallization systems of a semiconductor device. For instance, the test structure 250 may comprise a test region 260, which may represent a portion of a metallization system or a metallization layer 210, which may be formed on the basis of materials and process techniques as are also applied for forming a metallization system of a sophisticated semiconductor device. For example, the test region 260 may be formed on the basis of techniques as previously described with reference to the semiconductor device 100. It should be appreciated that the test structure 250 may be provided within a semiconductor device at a dedicated device region or the test structure 250 may be formed on a specified location above a substrate, for instance in a scribe lane of a semiconductor wafer and the like. Furthermore, it should be understood that the test structure 250 may be provided in the form of a dedicated semiconductor device which may be packaged and may be subjected to corresponding test procedures and environmental conditions, as required. In other cases, the test structure 250 may be formed above a substrate prior to separating the substrate into individual chips. As illustrated, the test region 260 may comprise a plurality of metal regions 212, for instance in the form of metal lines, which are embedded in a dielectric material 211, which may have any composition as required for the process technology under consideration. Similarly, the metal regions 212 may be formed on the basis of materials and techniques for which a corresponding evaluation may be required. For example, similar process techniques may be used, as previously described. Furthermore, the test structure 250 may comprise a current limiting structure 240 that is connected to the test region 260, for instance via an appropriately designed interconnect structure 230, in order to limit the current flow through the test region 260, or at least reduce the slope of current increase during a corresponding dielectric breakdown test to enable a reduction of test voltage or a switching off thereof at non-critical current values. The current limiting structure 240 may be provided in the form of a resistive structure, possibly in combination with further control mechanisms for implementing self-controlled increase of resistivity, if required. In other cases, the current limiting structure 240 may represent a resistive structure which may thus provide a limitation of a current flow, even if a significant change of conductivity may occur in the test region 260. As will be described later on in more detail, the resistive structure 240 may, in one illustrative embodiment, be formed in the same metallization layer 210 as the test region 260, while, in other cases, resistive components, such as semiconductor-based resistors and the like, may be provided and may be appropriately connected to the test region 260 on the basis of the interconnect structure 230. The interconnect structure 230 may have any appropriate configuration, i.e., metal features in the metallization system of the test structure 250 and the like, possibly in combination with appropriate contact elements connecting to a device level of the test structure 250, so as to provide the electrical connection between the structure 240 and the test region 260. Moreover, the interconnect structure 230 may also provide accessibility of the test structure 250 by external test equipment, such as a voltage source and the like. For this purpose, the interconnect structure 230 may comprise appropriate conductive paths formed in the metallization system of the structure 250, which may include appropriate contact pads (not shown) enabling access of probes of an external device or which may be connected to corresponding I/O (input/output) terminals of a corresponding package. Thus, as schematically illustrated in FIG. 2a, the interconnect structure 230 may provide contacts 231A, 231B to establish a voltage across the test structure 250. Moreover, as illustrated, in some illustrative embodiments, an additional contact 231C may be provided to enable individual access to the test region 260, if desired.

The test structure 250 may be formed on the basis of conventional process techniques as are also described previously with reference to the semiconductor device 100. It should be appreciated that the test structure 250 may be "used" in different stages of the overall manufacturing flow. For example, if a reliability test is desired without being influenced by additional metallization layers, which may have to be formed above the metallization layer 210 in actual semiconductor devices so as to provide the full functionality of the metallization system, the interconnect structure 230 may be appropriately configured to provide the contacts 231A, 231B within the metallization layer 210 under consideration. In other cases, the test structure 250 may be operated at a later manufacturing stage, for instance after completing the entire metallization system prior to or after separating a corresponding substrate, as previously explained. It should be appreciated that the test structure 250 may comprise additional test regions 260, which may be provided in different metallization levels of the corresponding metallization system, or which may be provided within the same metallization level, however, with different configuration of at least some components, as will also be described later on in more detail.

Figure 2B:
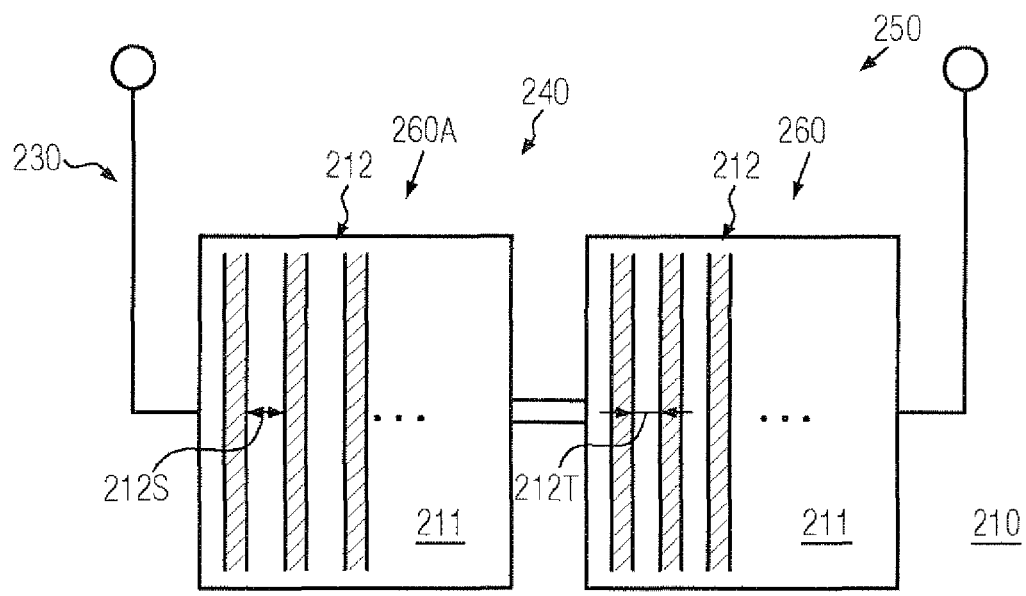
FIG. 2b schematically illustrates a top view of a test structure including a further critical test structure as a resistive current limiting component, according to still further illustrative embodiments.

FIG. 2b schematically illustrates the test structure 250 according to further illustrative embodiments in which the current limiting structure 240 may be provided in the form of an additional test region 260A, which may be formed in the same or a different metallization level in which is formed the test region 260. For example, in the embodiment shown, the additional test region 260A may be formed in the same metallization layer and may thus comprise the dielectric material 211 and corresponding metal lines 212, however, with a spacing 212S that may be greater than a spacing 212T, which may be provided between adjacent metal regions 212 of the actual test region 260. Thus, the additional test region 260A may have a higher dielectric strength compared to the actual test region 260 so that, upon exposure to sophisticated test conditions, a dielectric breakdown may occur in the actual test region 260 with a significantly higher probability compared to the additional region 260A, which may therefore act as a resistive structure or current limiting structure. The difference of the spacings 212S, 212T may be readily accomplished by using an appropriately designed lithography mask during the manufacturing sequence for forming the metallization layer under consideration, such as the metallization layer 210. In other illustrative embodiments, the additional test region 260A may be provided in a different metallization layer, for instance in a layer in which typically less critical conditions may occur, so that a corresponding application of stress conditions designed for evaluating the region 260 may result in a significantly higher dielectric strength of the region 260A. In this case, the interconnect structure 230 may be appropriately configured to provide the interlevel connection between the regions 260A, 260.

Figure 2C:
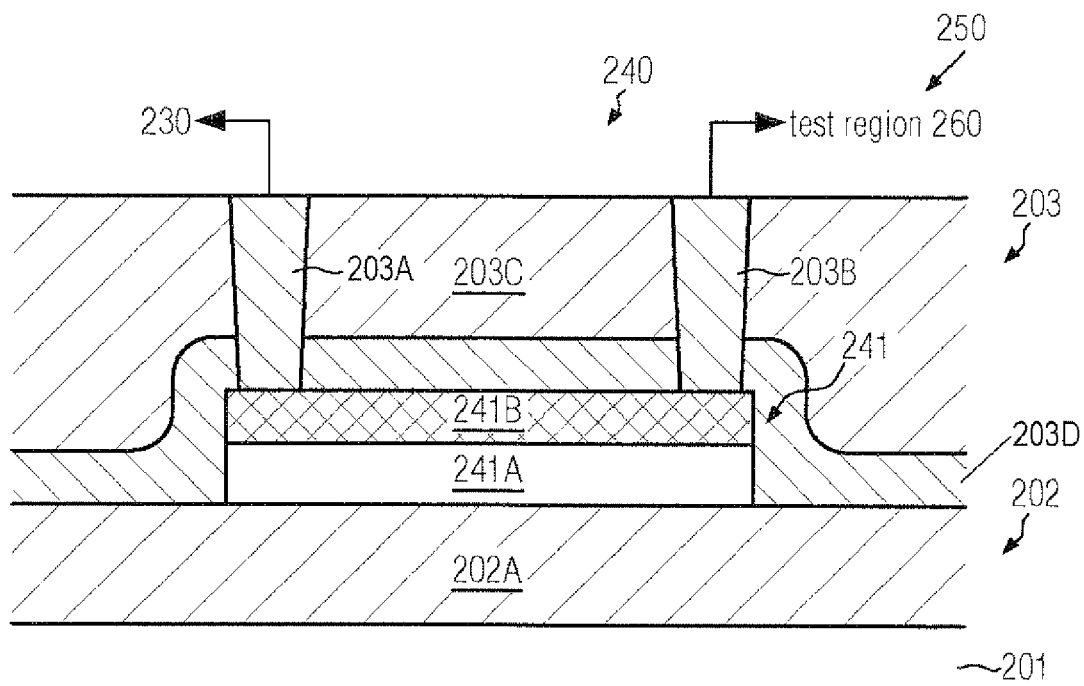
FIGS. 2c-2d schematically illustrate cross-sectional views of resistive structures used as current limiting components in the form of a semiconductor material, according to yet further illustrative embodiments.

FIG. 2c schematically illustrates a cross-sectional view of a portion of a current limiting structure 240 according to further illustrative embodiments, in which a resistive structure may be formed in the device level of the test structure 250. As illustrated, the structure 250 may comprise a substrate 201, such as a semiconductor substrate, an insulating substrate and the like, which is appropriate for forming thereabove an appropriate semiconductor material in order to form therein and thereabove corresponding semiconductor-based elements such as transistors and the like. In the embodiment shown, a device layer 202 may be formed above the substrate 201, which is to be understood as a layer including a semiconductor material (not shown) in combination with isolation regions 202A, which may be comprised of silicon dioxide and the like. Furthermore, a resistor 241 may be formed on or above the device layer 202 and may be comprised, at least partially, of a semiconductor material, such as polycrystalline silicon, a polycrystalline silicon/germanium mixture and the like, depending on corresponding device requirements, resistive structures in other areas of the corresponding semiconductor device and the like. It should be appreciated that the device layer 202, in combination with any semiconductor-based components formed thereon, may also be referred to as a device level of the test structure 250 and of respective semiconductor devices which may be formed together with a structure 250 in other areas of the substrate 201. In the embodiment shown, the resistor 241 may comprise the polycrystalline semiconductor material 241A in combination with a metal-containing material 241B, such as a metal silicide material, as may typically be used for increasing conductivity of silicon-based semiconductor materials. Consequently, by appropriately determining overall dimensions of the resistor 241 and the intrinsic conductivities of the materials 241A, 241B, the overall conductivity and current drive capability of the resistor 241 may be adjusted. Furthermore, a contact level 203 may be provided which may comprise one or more dielectric materials 203C, 203D in which are embedded respective contact elements 203A, 203B. The contact elements may connect to the resistor 241 and may be comprised of any appropriate metal material, such as tungsten and the like. The contact elements 203A, 203B may finally be connected to the test region 260 (see FIGS. 2a and 2b), for instance via the interconnect structure 230 (see FIGS. 2a and 2b), which may be formed in a corresponding metallization system to be formed above the contact level 203.

It should be appreciated that the resistor 241 may also be formed above a semiconductor material, i.e., above a portion of the device layer 202, which is comprised of a crystalline semiconductor material, wherein a corresponding insulating material may be provided between the crystalline semiconductor material of the layer 202 and the semiconductor material 241A. In this case, the resistor 241 may be referred to as a "buried" resistor.

A portion of the current limiting structure 240 as shown in FIG. 2c may be formed on the basis of well-established process techniques, for instance for forming transistor elements or resistive structures in other device areas, wherein, however, as previously explained, the lateral dimensions of the resistor 241 may be appropriately selected for a given ratio of the materials 241B, 241A and the corresponding intrinsic conductivities in order to adjust the total resistance value and the drive current capability thereof. Consequently, upon operating the test structure 250, the resistor 241 may provide a desired limitation of the current upon occurrence of a failure in the test region 260.

Figure 2D:
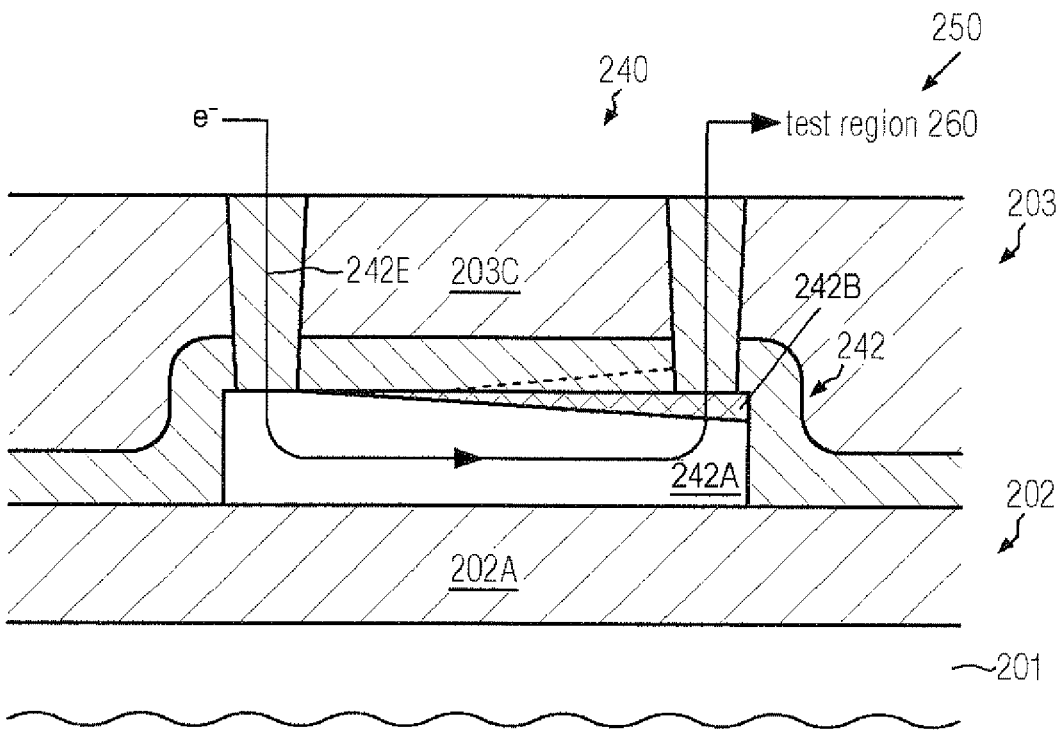

FIG. 2d schematically illustrates a portion of the current limiting structure 240 according to further illustrative embodiments in which a self-limiting resistive component 242 may be provided. In the embodiment shown, the resistive component 242 may comprise a semiconductor material 242A, for instance in the form of polycrystalline silicon, crystalline silicon and the like, in combination with a metal silicide region 242B. Furthermore, the resistive component 242 may have appropriate dimensions that may result in a desired resistance value for a certain current density created by a specified voltage drop across the component 242. Moreover, as previously explained with reference to the semiconductor device 100, electromigration is a well-known phenomenon that may occur in conductive lines upon increased current densities. This per se undesired effect may, however, frequently be taken advantage of in order to significantly change the conductivity state of a conductive line. For example, so-called electronic fuses may frequently be formed such that, upon application of an increased voltage and thus of a moderately high current density, significant electromigration may take place, which may thus result in a corresponding degradation of the conductive line, for instance caused by a diffusion of metal atoms and the like. Consequently, the conductive line may suffer from a "depletion" of a corresponding metal component, thereby reducing the overall conductivity thereof. Hence, a corresponding electronic fuse may be "programmed" by applying a corresponding high voltage and thus current density. Similarly, the resistive component 242 may be designed such that a pronounced electromigration effect may occur, when a moderately high voltage may be applied across the component 242. For example, in a corresponding test procedure, an electron flow 242E may be established, for instance via the interconnect structure and the test region 260, as previously explained. That is, the electron flow 242E may represent the corresponding leakage current created during the sophisticated test conditions. Without the occurrence of a dielectric breakdown event in the test region 260, the electron flow 242E may substantially not result in a significant electromigration effect, so that a moderately high conductivity may be maintained in the component 242. Upon a dielectric breakdown event in the test region 260, the conductivity thereof may rapidly increase, thereby resulting in an increased voltage drop across the component 242, which in turn may create a corresponding increased electron flow 242E. In this case, a significant electromigration may occur and may thus result in a reduced conductivity, which may therefore reduce the electron flow 242E, or which may at least slow down the overall increase of the current flow. Hence, a self-limiting mechanism may be accomplished by means of the resistive component 242.

It should be appreciated that, in other illustrative embodiments, one or more resistive components 242 may be used as a portion of the resistive structure 240 in a "pre-programmed" manner so that a desired resistance value may be obtained, which may be considered as a substantially stable resistance value, thereby also providing a current limiting effect, as is, for instance, described above with reference to the resistor 241.

Figure 2E:
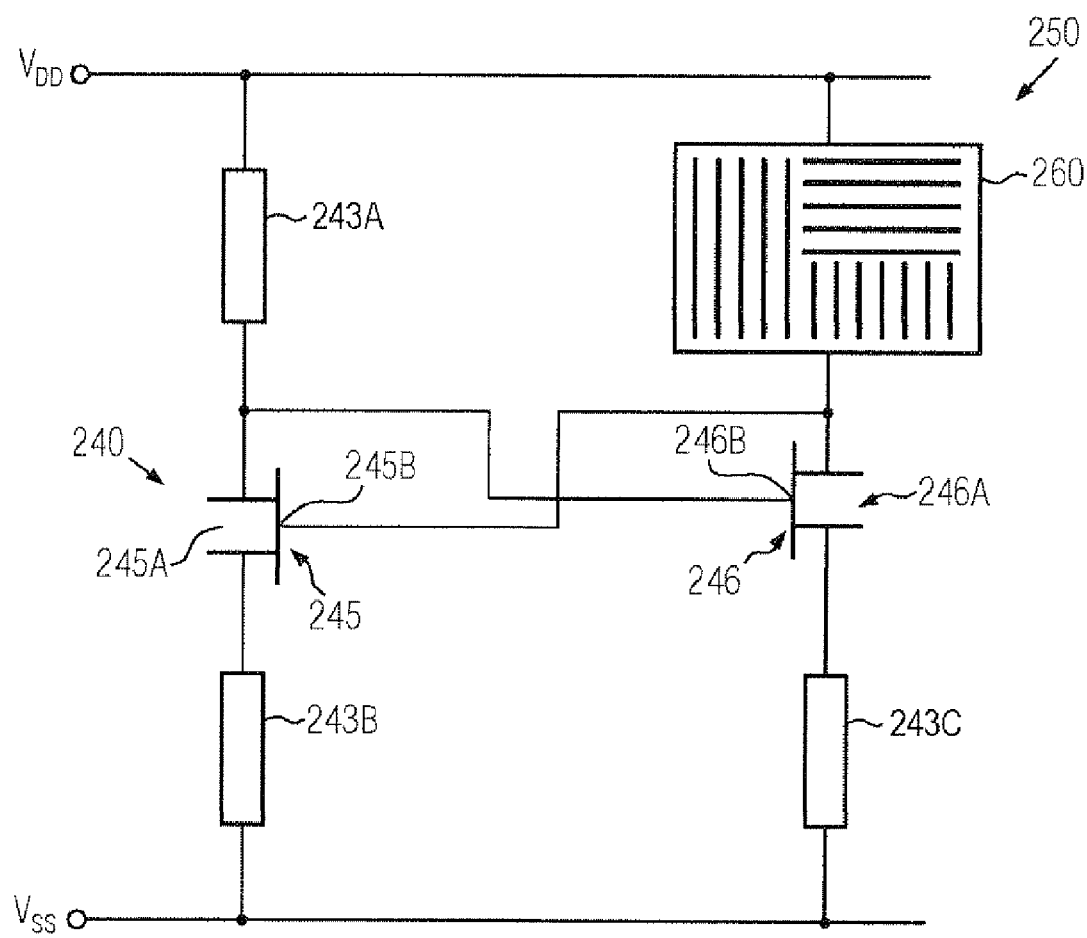
FIG. 2e schematically illustrates a test structure including a "transistor flip flop" for restricting the current flow through a test region, according to still further illustrative embodiments.

FIG. 2e schematically illustrates the test structure 250 according to further illustrative embodiments in which a current limiting function may be implemented in the structure 240 on the basis of resistors 243A, 243B, 243C, which may have any appropriate configuration, for instance in the form as previously described with reference to the resistor 241 (FIG. 2c). Moreover, a first transistor 246 may be connected with its controllable current path 246A between the resistor 243C and the test region 260. Similarly, a second transistor 245 is connected with its controllable current path 245A between the resistors 243A and 243B. Moreover, a control terminal 246B of the transistor 246 is connected to a node of the current path between the resistor 243A and the current path 245A. Similarly, a control terminal 245B of the transistor 245 may be connected to a node connected to a current path from the test region 260 to the controllable current path 246A. For example, the configurations of the resistors 243A, 243B, 243C and the test region 260, which may also be considered as a resistive structure, in combination with the transistors 246 and 245, may be referred to as a transistor flip flop. It should be appreciated that the transistors 245, 246 may be formed on the basis of any appropriate manufacturing techniques, in combination with corresponding transistor elements of a semiconductor device, which may be accomplished above the device layer 202 (FIG. 2d).

Upon operating the test structure 250 including the current limiting structure 240 as shown in FIG. 2e, the voltage at the control terminal 246B may result in a certain degree of drive current capability of the transistor 246, thereby enabling a current flow through the test region 260 corresponding to the dielectric status thereof. Since, in an initial phase of the dielectric breakthrough test, a moderately low voltage is supplied to control terminal 245B of the transistor 245, the transistor is held in a moderately high ohmic state, which in turn may result in a corresponding high voltage at the terminal 246B. If a corresponding increase of conductivity may occur in the test region 260 due to a dielectric breakdown, the voltage at the transistor 246 may increase, thereby also increasing the voltage of the control terminal 245B, which in turn may increase conductivity of the transistor 245 or switch on the transistor 245, resulting in a corresponding voltage drop at the control input 246B of the transistor 246, which may thus reduce the current flow through the region 260 or at least significantly slow down a corresponding increase of the leakage current. Consequently, an efficient self-controlling mechanism may be accomplished on the basis of the cross-coupled transistors 245, 246 in combination with the corresponding resistive structures 243A, 243B and 243C.

Figure 2F:
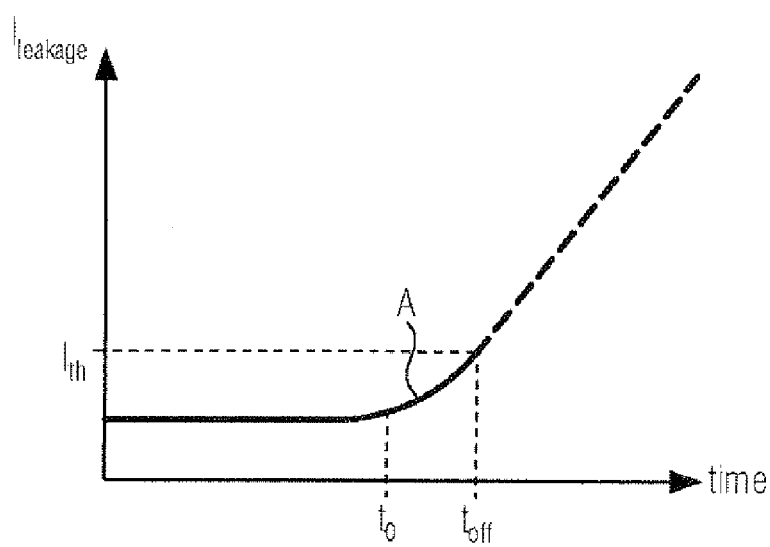
FIG. 2f schematically illustrates the progression in time of a leakage current during a test procedure in which the test voltage may be shut down in a reliable manner prior to exceeding a predefined threshold, according to still further illustrative embodiments.

FIG. 2f schematically illustrates the behavior of the test structure 250 during operation thereof. As previously explained with reference to the test structure 150, typically, sophisticated environmental conditions may be applied, for instance elevated temperatures, an increased degree of humidity, mechanical stress and the like, possibly in combination with an appropriately selected test voltage. Thus, depending on the status of the test region 260, a certain degree of leakage current may be observed, which may remain substantially constant unless a significant modification of material characteristics may occur due to the exposure to the sophisticated test conditions. For example, at time $t_0$, a dielectric breakthrough may occur in a restricted area of the test region 260, as is also previously described with reference to the test structure 150, and thus the leakage current may increase due to a reduced resistivity of the specific damaged area. However, contrary to the conventional test structure 150 (FIG. 1b), the current limiting behavior or the built-in compliance functionality of the test structure 250 may reduce or slow down the increase of the leakage current, which may thus result in a significantly less pronounced slope of the leakage current, as indicated by curve A in FIG. 2f. Consequently, a corresponding increase of a leakage current may be efficiently detected by the external test equipment and a corresponding reduction of the test voltage or a shut down of the voltage source may be initiated, which may thus avoid additional secondary damages in the test region 260 due to the increased current flow. For example, as illustrated in FIG. 2f, a threshold value may be defined in advance, at which the externally supplied voltage may be shut down in order to avoid further damage in the test region 260. Due to the current limiting effect of the structure 240, the switching off of the externally supplied voltage may be accomplished within a time interval, during which a resulting leakage current may still be below a critical value. For example, during the time interval $t_0$, which may correspond to the occurrence of the corresponding breakdown event in the test region 260, and the time $t_{off}$, which may correspond to time at which the supply voltage is actually switched off, only a moderately high increase of current may occur without creating significant secondary current-induced damage. Consequently, by determining the time $t_{off}$, a corresponding measure of the reliability of the test region 260 and thus of the corresponding metallization layer may be obtained while still providing the possibility of performing further analysis techniques in order to obtain information about the actual failure mechanisms. For example, the further analysis may be performed based on cross-sectional analysis techniques, such as electron microscopy and the like.

As a result, the present disclosure provides test structures and techniques for using the same in which additional information may be obtained by substantially avoiding or at least significantly reducing "secondary" damage in a test region by incorporating a built-in compliance functionality, which may enable the switching off of the test voltage prior to causing current-induced damage in the test structure upon occurrence of a dielectric break-down event. Thus, extremely sophisticated external test equipment with fast electronic components requiring a high degree of time resolution may be avoided, since the built-in compliance functionality may respond to the dielectric breakdown event within a time scale that is comparable to the time scale of significant current increase in a failure area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A test structure for monitoring dielectric characteristics of a metallization system of a semiconductor device, said test structure comprising:
   a test region formed above a substrate and comprising a plurality of test metal regions formed in a dielectric material of a metallization level;
   a current limiting structure formed above said substrate, wherein said current limiting structure comprises a resistive structure that is at least partially formed in said dielectric material and has a higher dielectric strength compared to said test region; and
   an interconnect structure connecting to said test region and to said current limiting structure, said interconnect structure configured to electrically connect said current limiting structure and said test region and to enable application of a voltage within a specified range across said test region and said current limiting structure by an external test device.

2. The test structure of claim 1, wherein said test region comprises metal lines having a spacing of approximately 100 nm or less.

3. The test structure of claim 1, wherein said dielectric material comprises a low-k dielectric material.

4. The test structure of claim 1, wherein said resistive structure comprises reference metal lines formed in said dielectric material and wherein said spacing between adjacent two of said reference metal lines is greater than a spacing between two of said test metal regions in said test region.

5. The test structure of claim 1, wherein an area of said resistive structure is less than an area of said test region.

6. The test structure of claim 1, wherein said current limiting structure comprises a resistive structure that is formed on the basis of a semiconductor material.

7. The test structure of claim 6, wherein said resistive structure is formed in a crystalline semiconductor region.

8. The test structure of claim 6, wherein said resistive structure further comprises a metal silicide material.

9. The test structure of claim 8, wherein said resistive structure is configured to provide a depletion of said metal silicide material at a voltage within said specified range.

10. The test structure of claim 1, wherein said current limiting structure comprises a first transistor element having a control terminal and a current path controlled by said control terminal and wherein said current path is electrically connected to said test region.

11. The test structure of claim 10, further comprising a second transistor electrically connected with a control terminal thereof to said test region, wherein said second transistor provides a control signal to said control terminal of said first transistor.

12. A dielectric breakdown test structure, comprising:
   a test region formed in a metallization system of a semiconductor device;
   a resistive structure electrically connected in series with said test region, wherein said resistive structure comprises a portion of said metallization system having a higher dielectric strength compared to said test region; and
   an interconnect structure at least partially formed in said metallization system and electrically connected to said test region and said resistive structure, said interconnect structure being configured to enable electrical contact with an external test device.

13. The dielectric breakdown test structure of claim 12, wherein said resistive structure is at least partially formed in a device level of said semiconductor device.

14. The dielectric breakdown test structure of claim 13, wherein said resistive structure comprises a polycrystalline semiconductor material.

15. The dielectric breakdown test structure of claim 13, wherein said resistive structure comprises a metal silicide material.

16. The dielectric breakdown test structure of claim 12, further comprising a transistor element connected to said resistive structure and said test region.

17. A method, comprising:
provraising a test structure comprising a test region for testing dielectric characteristics of a metallization system of a semiconductor device, said test structure further comprising an internal current limiting structure connected in series with said test region, wherein said current limiting structure comprises a resistive structure that is at least partially formed in a dielectric material and has a higher dielectric strength compared to said test region;
applying a voltage across said test region and said current limiting structure;
monitoring a current flowing through said test region; and
at least reducing said voltage when said current exceeds a predefined threshold.

18. The method of claim 17, further comprising applying predefined stress conditions when applying said voltage.

19. The method of claim 17, further comprising performing failure analysis with said test region when said predefined threshold has been exceeded.

* * * * *